United States Patent
Liou et al.

(10) Patent No.: US 8,954,919 B1
(45) Date of Patent: Feb. 10, 2015

(54) CALCULATION METHOD FOR GENERATING LAYOUT PATTERN IN PHOTOMASK

(71) Applicant: United Microelectronics Corp., Hsin-Chu (TW)

(72) Inventors: En-Chiuan Liou, Tainan (TW);
Sho-Shen Lee, New Taipei (TW);
Wen-Liang Huang, Hsinchu (TW);
Chang-Mao Wang, Tainan (TW);
Kai-Lin Chuang, Tainan (TW);
Yu-Chin Huang, Yunlin County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/069,391

(22) Filed: Nov. 1, 2013

(51) Int. Cl.
  *G06F 17/50* (2006.01)
(52) U.S. Cl.
  CPC ...................................... *G06F 17/50* (2013.01)
  USPC ............................................ 716/139; 716/55
(58) Field of Classification Search
  USPC .................................................. 716/55, 139
  See application file for complete search history.

(56) References Cited

U.S. PATENT DOCUMENTS

| | | | |
|---|---|---|---|
| 6,013,395 A | 1/2000 | Matsuura | |
| 7,245,356 B2 * | 7/2007 | Hansen | ........................... 355/67 |
| 7,598,007 B2 | 10/2009 | Yamamoto | |
| 2004/0241555 A1 | 12/2004 | Sheu | |
| 2008/0090157 A1 | 4/2008 | Chung | |
| 2012/0107731 A1 | 5/2012 | Tseng | |

OTHER PUBLICATIONS

Mask 3D effects: impact on Imaging and Placement, Jo Finders and Thijs Hollink, BACUS, vol. 27, Issue 9, Sep. 2011.

* cited by examiner

*Primary Examiner* — Thuan Do
(74) *Attorney, Agent, or Firm* — Winston Hsu; Scott Margo

(57) ABSTRACT

A calculation method for generating a layout pattern in a photomask includes at least the following steps. A two-dimensional design layout including several geometric patterns distributed in a plane is provided to a computer system. The computer system is used to mark portions of the geometric patterns and generate at least one marked geometric pattern and at least one non-marked geometric pattern. The marked geometric pattern is then simulated and corrected by the computer system so as to generate a 3-D design layout. Through the simulation and correction, the marked geometric pattern and the non-marked geometric pattern are arranged alternately along an axis orthogonal to the plane. The 3-D design layout is outputted to a mask-making system afterwards.

20 Claims, 6 Drawing Sheets

CALCULATION METHOD FOR GENERATING LAYOUT PATTERN IN PHOTOMASK

BACKGROUND OF THE INVENTION

1. Field of the Invention

The present invention generally relates to a layout pattern of a photomask, and more particularly to a calculation method for generating a layout pattern in a photomask.

2. Description of the Prior Art

As the integrated circuit (IC) manufacturing industry moves towards smaller device dimensions, the resolution enhancement techniques (RET) for optical lithography such as off-axis illumination (OAI), optical proximity correction (OPC) and the phase-shifting mask (PSM) have been implemented in conjunction with reducing the wavelength of optical exposure.

Currently, in order to further increase the depth-of-focus (DOF) during a photolithography process, layout patterns on the photomasks are often designed to have different thicknesses. In this way, the optical path between the layout patterns and a layer to be printed with the layout patterns may be adjusted. Accordingly, the DOF corresponding to certain regions of the layout pattern may be increased so as to increase the exposure resolution during the photolithographic process.

However, there are still some optical problems, such as flares and distortions, which cannot be solved effectively even if the photomasks are designed to have the layout patterns in different thicknesses. As a result, how to generate layout patterns on photomasks so as to overcome these optical problems is still a big issue nowadays.

SUMMARY OF THE INVENTION

One objective of the present invention is to provide a calculation method used to generate a 3-D layout pattern in a photomask.

To this end, a calculation method for generating a layout pattern in a photomask is provided according to one embodiment of the present invention. The method includes at least the following steps. First, a two-dimensional design layout including several geometric patterns distributed in a plane is provided to a computer system. The computer system is used to mark portions of the geometric patterns and generate at least one marked geometric pattern and at least one non-marked geometric pattern. The marked geometric pattern is then simulated and corrected by the computer system so as to generate a 3-D design layout. Through the simulation and correction, the marked geometric pattern and the non-marked geometric pattern are arranged alternately along an axis orthogonal to the plane. The 3-D design layout is outputted to a mask-making system afterwards.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
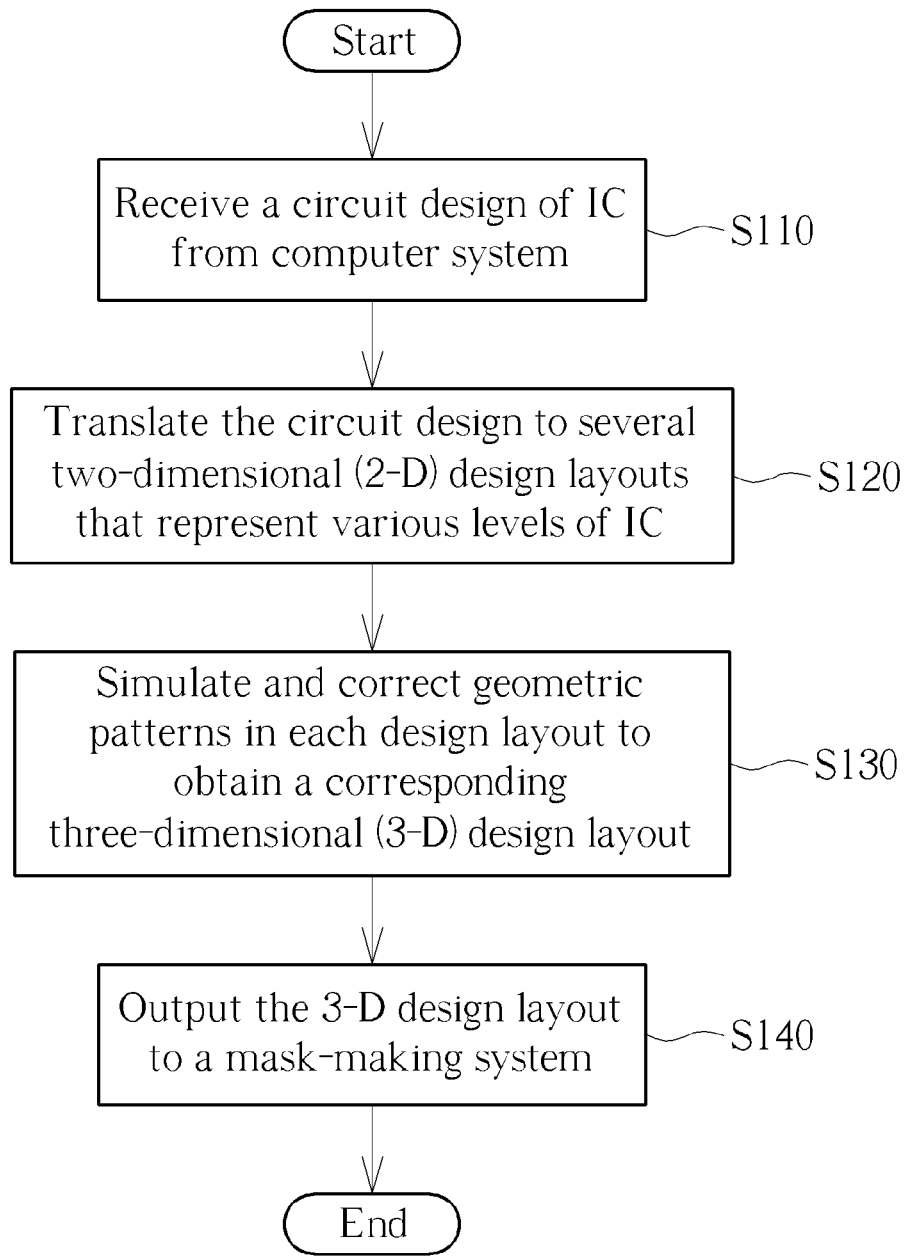
FIG. 1 and FIG. 2 are simplified flow charts showing steps for generating a layout pattern in a photomask.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 2:
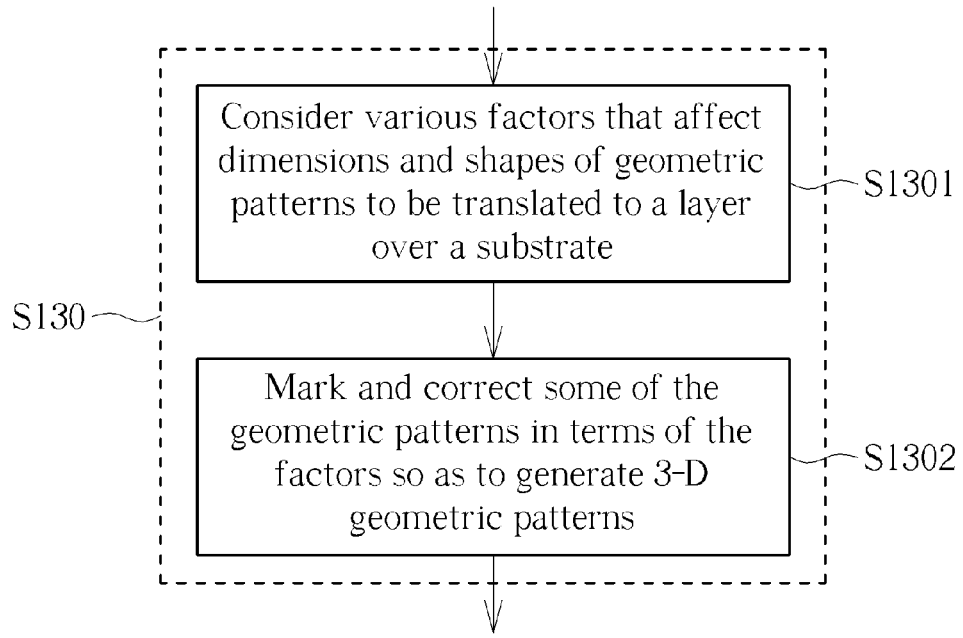

Please refer to FIG. 1 and FIG. 2. FIG. 1 and FIG. 2 are simplified flow charts showing steps for generating a layout pattern in a photomask. As shown in FIG. 1, in step S110, a circuit design of an integrated circuit (IC) in electronic form is received by a computer-aided-design (CAD) system from a computer system. The circuit design may be created by circuit designers in an IC design house and may be mainly composed of elements such as contact plugs, contact slots, vias and interconnection lines used to electrically connect active devices within the IC. In step S120, the received circuit design is then calculated by the CAD system and translated to several two-dimensional (2-D) design layouts that represent various levels of the IC. Each 2-D design layout may include several 2-D geometric patterns such as straight lines, bent lines, circles and/or polygons. In step S130, the geometric patterns in each design layout are simulated and corrected through specific simulation and correction software. Through the simulation and the correction, the contours, as well as the vertical positions, of the geometric patterns may be adjusted and a 3-D design layout may be therefore generated. Precisely, step S130 may further include at least two sub-steps, e.g. steps S1301 and S1302. In step S1301, various factors that could affect dimensions and contours of geometric patterns to be translated to a layer over a substrate are considered and are regarded as parameters to adjust and/or correct the contours and the vertical positions of the corresponding geometric patterns in the 2-D design layout. In detail, these factors include densities of patterns, shapes of patterns, film thickness uniformity, and substrate topography, but not limited thereto. In step S1302, some of the geometric patterns in the 2-D design layout are then marked in terms of the above-mentioned factors. Afterwards, in step S140, an electronic file of the 3-D design layout is transmitted to a mask-making system.

According to the above-mentioned paragraphs, one characteristic feature of the embodiment of the present invention is that each 2-D design layout consisting of several 2-D geometric patterns may be converted to the corresponding 3-D design layout through the corresponding simulation and correction processes. The electronic files including these 3-D design layouts may be then sent to the mask-making system so as to fabricate photomasks with the 3-D design layouts.

In the following paragraphs, various embodiments of a calculation method for generating a layout pattern in a photomask are elaborated. These embodiments are intended to be protected broadly within the spirit and scope of the appended claims.

Figure 3:
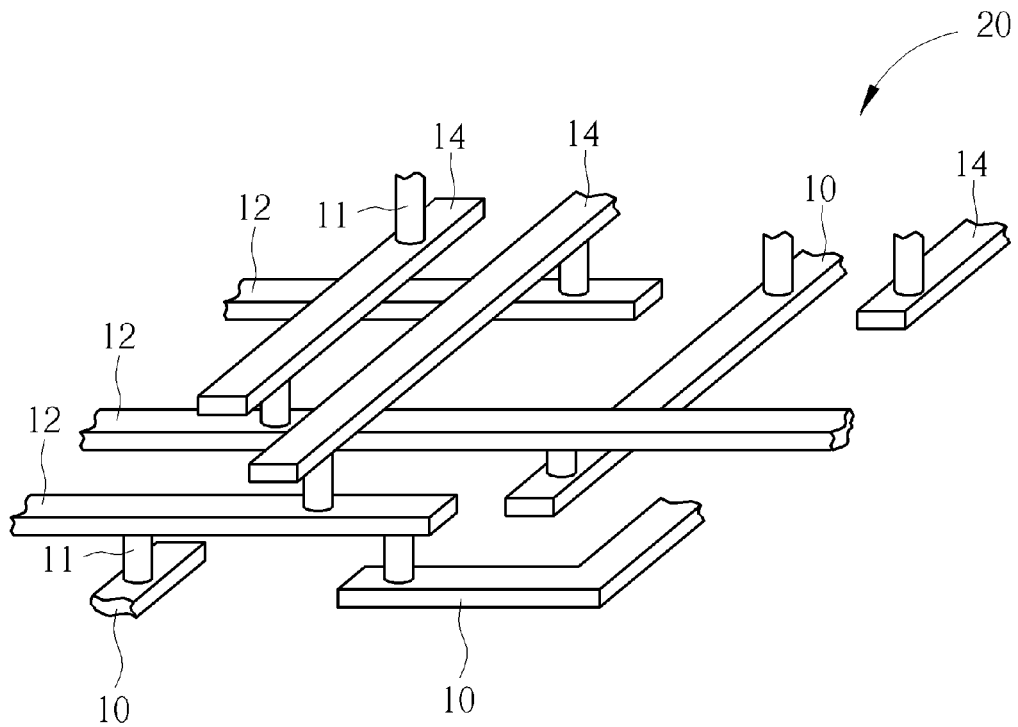
FIG. 3 to FIG. 9 are schematic diagram showing a method for generating a layout pattern in a photomask according to a first embodiment of the present invention.

Please refer to FIG. 3 to FIG. 9. FIG. 3 to FIG. 9 are schematic diagram showing a method for generating a photomask and a layout pattern therein according to a first embodiment of the present invention. Referring to FIG. 1 and FIG. 3, in step S110, a circuit design 20 of an IC in electronic form is received by a CAD system from a computer system. The circuit design 20 has a stacked structure mainly composed of elements such as contact plugs, contact slots, vias and interconnection lines used to electrically connect active devices within the IC. The circuit design 20 may be designed by circuit designers in an IC design house, but not limited thereto. According to the first embodiment of the present invention, the circuit design 20 is at least composed of vias 11, straight and bent interconnection lines 10, 12 and 14, but not limited thereto. The interconnection lines 10, 12, and 14 may be electrically connected to one another through the corresponding vias 11 and interconnection lines 10, 12, and 14. For example, some of the upper interconnection lines 14 may be electrically connected to the lower interconnection lines 10 through vias 11 in different levels and through the corresponding middle interconnection line 12. It should be noted that the circuit design may be a multi-layered structure including more than three layers of vias and more than three layers of interconnection lines, but not limited thereto.

Figure 4:
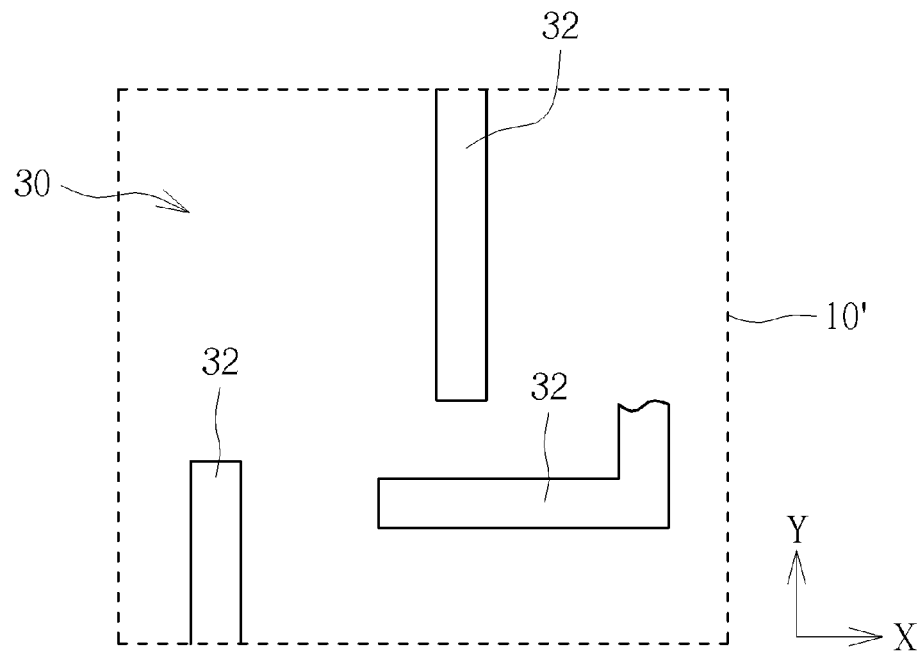
Figure 5:
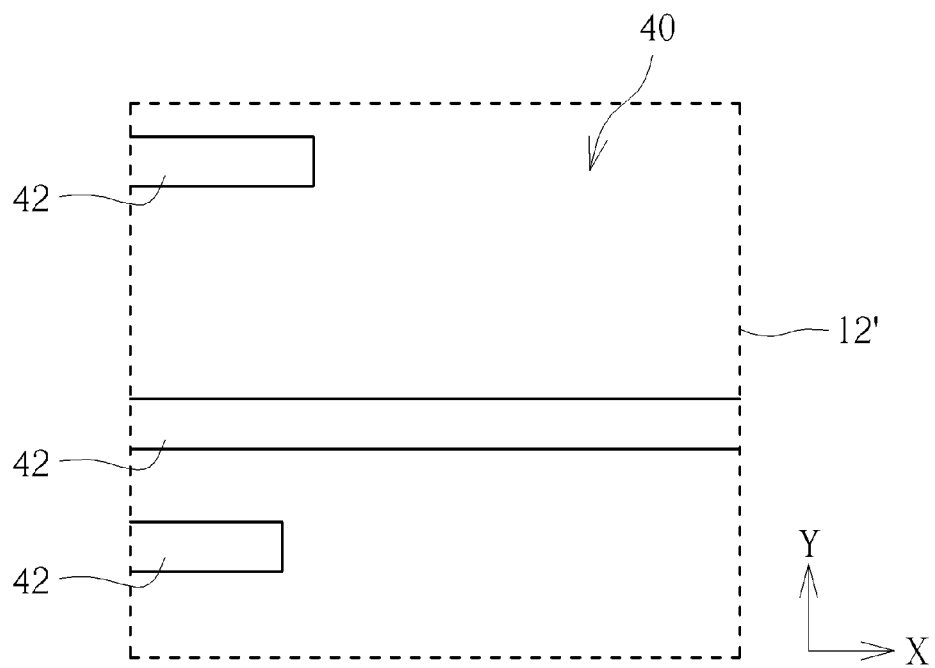
Figure 6:
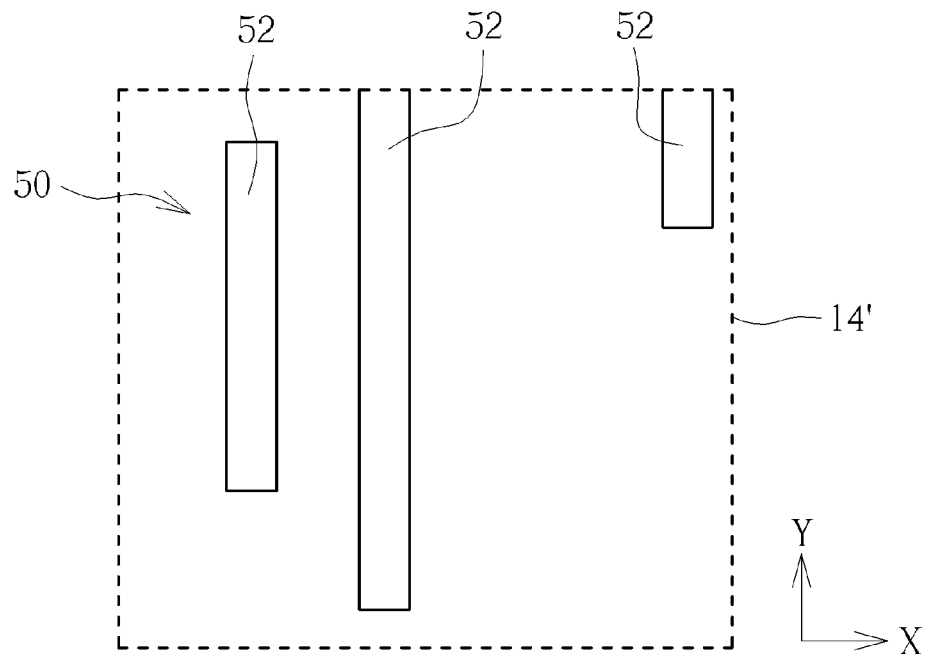
Figure 7:
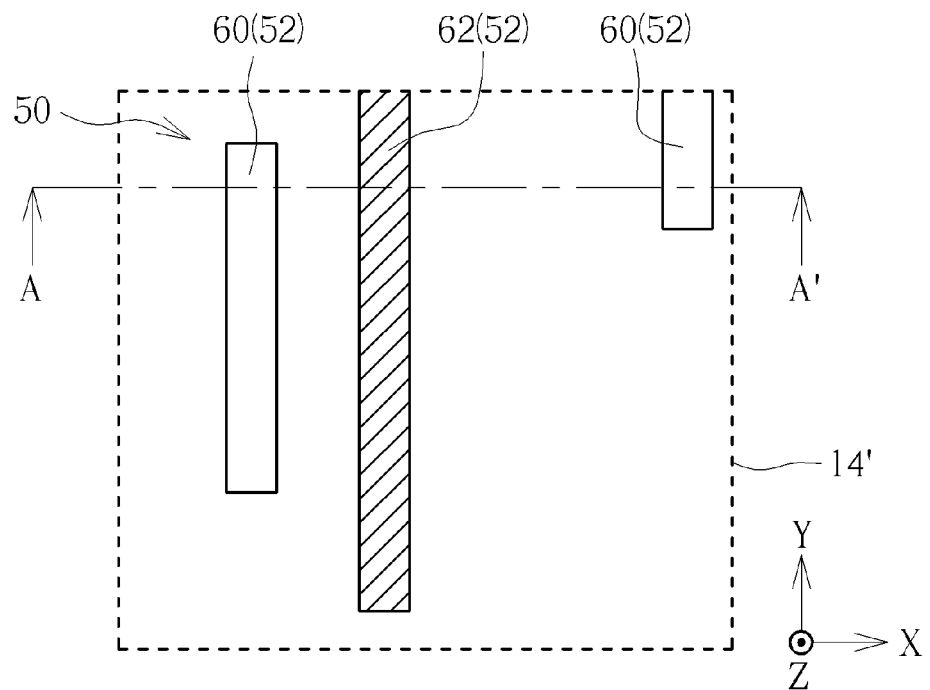

Please refer to FIG. 4, FIG. 5, and FIG. 6. In step S120, the circuit design 20 stored in the CAD system is calculated and then translated to several 2-D design layouts that represent various levels of the IC. According to the first embodiment of the present invention, at least three 2-D design layouts that represent various levels of the interconnection lines are generated and are shown in FIG. 4, FIG. 5, and FIG. 6 respectively. Referring to FIG. 3 and FIG. 4, a first 2-D design layout 30 corresponding to the lower interconnection lines 10 is generated through step S120 and stored as a first electronic file 10'. In the first electronic file 10', several 2-D geometric patterns 32 are distributed in the first 2-D design layout 30, and the dimensions and the contours of the geometric patterns 32 are generated corresponding to those of the lower interconnection lines 10 in the circuit design 20. Similarly, referring to FIG. 3 and FIG. 5, a second 2-D design layout 40 corresponding to the middle interconnection lines 12 is generated through step S120 and stored as a second electronic file 12'. In the second electronic file 12', several 2-D geometric patterns 42 are distributed in the second 2-D design layout 40, and the dimensions and the contours of the geometric patterns 42 are generated corresponding to those of the middle interconnection lines 12 in the circuit design 20. Besides, referring to FIG. 3 and FIG. 6, a third 2-D design layout 50 corresponding to the upper interconnection lines 14 is also generated through step S120 and stored as a third electronic file 12'. In the third electronic file 12', several 2-D geometric patterns 52 are distributed in the third 2-D design layout 40, and the dimensions and the contours of the geometric patterns 52 are generated corresponding to those of the upper interconnection lines 14 in the circuit design 20.

After the above steps, in step S130, the geometric patterns in each design layout are then simulated and corrected through specific simulation software. Precisely, step S130 may further include at least two sub-steps, e.g. steps S1301 and S1302. In step S1301, various factors that could affect dimensions and contours of geometric patterns to be translated to a layer over a substrate are considered and are treated as parameters to adjust the contours, the vertical positions, or even the thicknesses of the corresponding geometric patterns in the 2-D design layout. In this way, each of the original 2-D design layouts can be converted to the corresponding 3-D design layouts. In detail, these factors may include densities of patterns, shapes of patterns, film thickness uniformity, and substrate topography, but not limited thereto. In step S1302, some of the geometric patterns in the 2-D design layout are then marked in terms of the above-mentioned factors during the simulation and the correction. In this way, at least one marked geometric pattern and at least one non-marked geometric pattern are generated.

Figure 8:
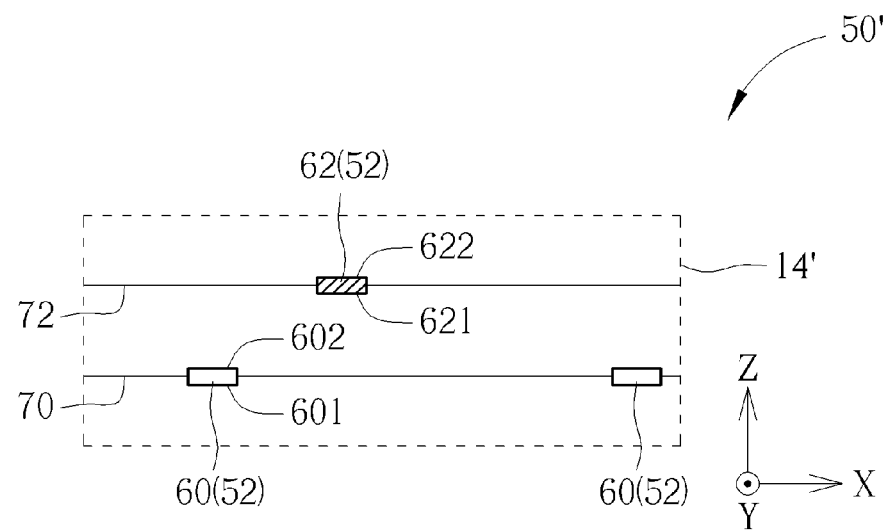

In the following description, an exemplary example corresponding to steps S130, S1301, and S1302 is illustrated for the sake of clarity. Please refer to FIG. 1, FIG. 2, FIG. 7 and FIG. 8. By taking the geometric patterns 52 as an example, in step S1301, various factors such as densities of the geometric patterns 52, contours of the geometric patterns 52, corresponding film thickness uniformity, substrate topography and so forth are considered as a simulation basis. Then, in step S1302, corresponding simulation and correction processes are carried out to adjust or correct the contours of the geometric patterns 52. Besides, some of the geometric patterns 52 may be marked in step S1302 to become marked geometric patterns 62, while the rest of the geometric patterns 52 may become non-marked geometric patterns 60. Please refer to FIG. 8, which is a schematic diagram taken along a line A-A' in FIG. 7. As shown in FIG. 8, in step S1302, the non-marked geometric patterns 60 are optionally adjusted along a z-axis orthogonal to an x-y plane so that they are remained in the original position or moved to a relatively low position with a first axis value 70, while the marked geometric pattern 62 is adjusted along the z-axis and moved to a relatively high position with a second axis value 72. In this way, the original 2-D design layout 50 is converted to the corresponding 3-D design layout 50' which includes geometric patterns 52 distributed in a 3-D space.

It should be noted that, as shown in FIG. 8, since the second axis value 72 is not equal to the first axis value 70, the marked geometric pattern 62 may be therefore spaced apart from the non-marked geometric patterns 60. In detail, both the marked geometric pattern 62 and the non-marked geometric patterns 60 are further defined with bottom boundaries 601 and 621 and top boundaries 602 and 622 after step S1302. If the bottom boundaries 601 and 621 do not overlap the corresponding top boundaries 602 and 622, the marked geometric pattern 62 and the non-marked geometric patterns 60 may have their own thickness values. Preferably, the thickness of the marked geometric pattern 62 and the non-marked geometric patterns 60 are all equal, but not limited thereto. Still referring to FIG. 8, the bottom boundary 621 of the marked geometric pattern 62 is spaced apart from the top boundaries 602 of the non-marked geometric patterns 60 along the z-axis after step S1302 according to this embodiment of the present invention. However, in order to meet the specific requirements, the bottom boundary of the marked geometric pattern may be set to align with the top boundaries of the non-marked geometric patterns along the z-axis, but not limited thereto.

Figure 9:
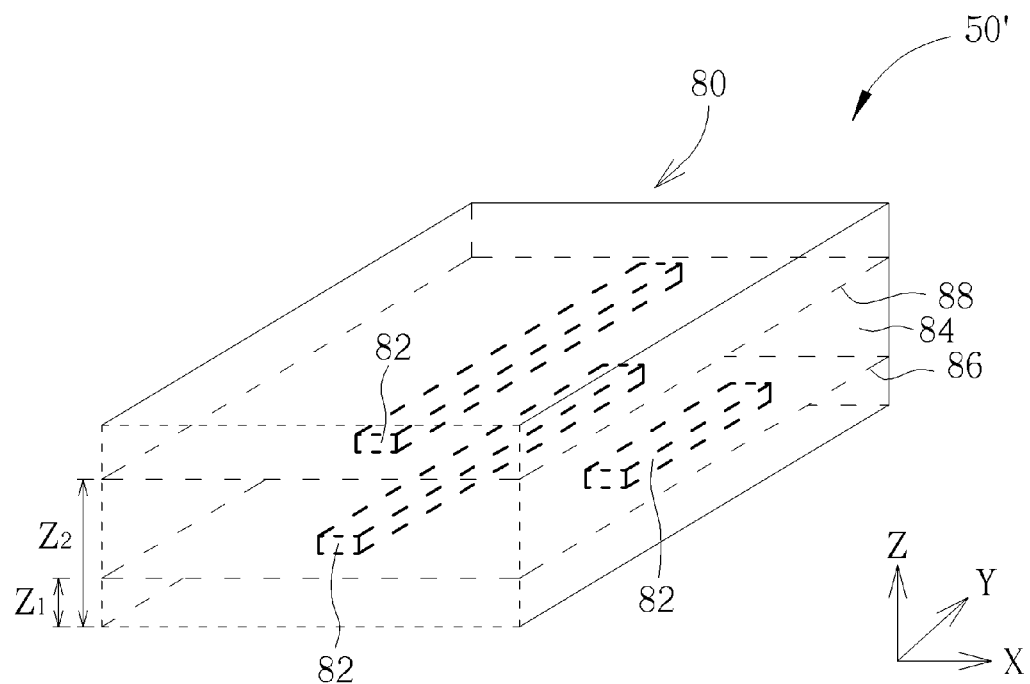

After step S130, in step S140, the corresponding 3-D design layout 50' may be sent to a mask-making system, such as a 3-D printing system, to fabricate a photomask including the geometric patterns 52 defined in 3-D design layout 50'. Please refer to FIG. 9. FIG. 9 is a schematic perspective view of a photomask according to a first embodiment of the present invention. Referring to FIG. 9, the photomask 80 with the above-mentioned 3-D design layout 50' may be obtained after the 3-D design layout 50' is sent to the mask-making system. The circuit pattern of the photomask 80 includes opaque geometric patterns 82 and is embedded in transparent layers 84. The composition of the opaque geometric patterns 82 may be chosen from chromium, chromium oxide ($CrO_x$) and tungsten silicide ($WSi_x$), while the composition of the transparent layers 84 may be chosen from quarts ($SiO_2$), calcium fluoride ($CaF_2$), and magnesium fluoride ($MgF_2$), but not limited thereto. Since the positions of the opaque geometric patterns 82 are respectively corresponding to the positions of marked geometric pattern 62 or the non-marked geometric patterns 60 defined by the computer system, the opaque geometric patterns 82 in the photomask 80 may be distributed along the z-axis and with different z-axis values. In this case, the opaque geometric patterns 82 adjacent to the peripheries of the photomask 80 are disposed in a first plane 86 with a z-axis value Z1, while the opaque geometric patterns 82 in proximity to the center of the photomask 80 is disposed in a second plane 88 with a z-axis value Z2. Preferably, the z-axis value Z1 is less than or different from the z-axis value Z2 according to the first embodiment of the present invention, but not limited thereto.

After the fabrication of the photomask 80, it may be transmitted to an exposure system, such as a wafer stepper, in order to further transfer the 3-D design layout 50' to a layer on a substrate, such as a silicon wafer. According to one embodiment of the present invention, for example, the photomask 80 may be set above a projection optical system and be radiated by light with predetermined wavelength. During the exposure, light may pass through the photomask 80 and finally reach the layer. As a result, shrunk patterns corresponding to the 3-D design layout 50' may be formed in the layer on the substrate. It should be noted that, although the patterns of the photomask 80 is distributed in planes with different axis values, e.g., Z-axis values, the shrunk patterns formed in the layer are preferably distributed in the same plane, e.g., in an X-Y plane. After the formation of the patterned layer, the patterns may be further transferred to the underlying substrate through suitable etching process so as to obtain required semiconductor structures.

One characteristic feature of the first embodiment of the present invention is that the 3-D design layout 50' includes geometric patterns 52 distributed along the z-axis. In this way, the corresponding photomask 80 fabricated by the 3-D printing system or the like may have the same features defined by the 3-D design layout 50'. As a result, the optical problems, such as flares or distortions possibly resulting from the following photolithographic process, may be prevented or overcome by using the photomask with the 3-D design layout.

In addition, other types of 3-D design layouts according embodiments of the present invention may also be provided. In the following paragraph, various embodiments of 3-D design layouts are disclosed and the description below mainly focuses on differences among each embodiment. In addition, like or similar features will usually be described with same reference numerals for ease of illustration and description thereof.

Figure 10:
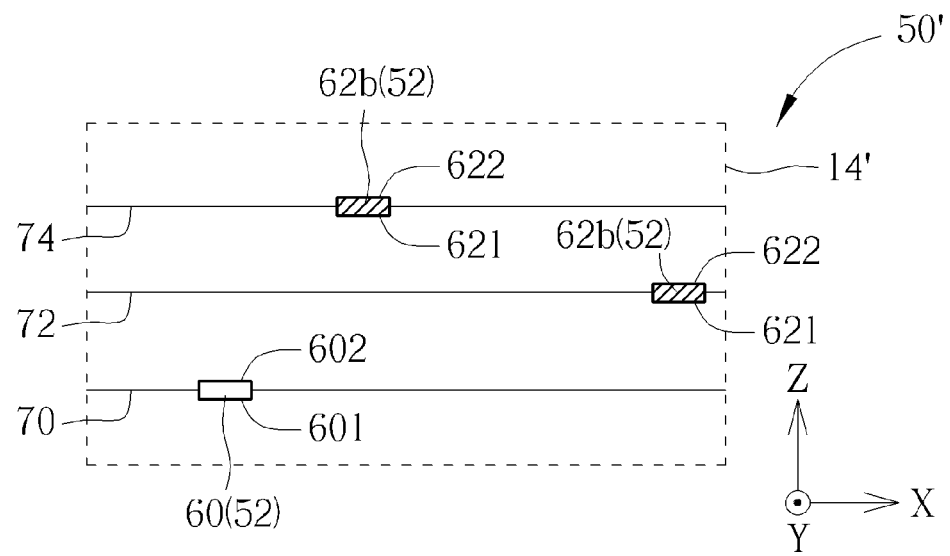
FIG. 10 is a schematic diagram showing a 3-D design layout according to a second embodiment of the invention.

Please refer to FIG. 10. FIG. 10 is a schematic diagram showing a 3-D design layout according to a second embodiment of the present invention. The 3-D design layout 50' shown in FIG. 10 according to the second embodiment of the invention is similar to that shown in FIG. 8 according to the first embodiment of the present invention. One main difference between these two embodiments is that the marked geometric patterns may be further classified into two types, e.g. a first marked geometric pattern 62a and a second marked geometric pattern 62b. According to this embodiment, since the first marked geometric pattern 62a and the second marked geometric pattern 62b have the second axis value 72 and a third axis value 74 respectively, the non-marked geometric pattern 60, the first marked geometric pattern 62a, and the second marked geometric pattern 62b may be therefore arranged alternately along the z-axis after step S130. Similarly, all the marked geometric patterns 62a and 62b and the non-marked geometric patterns 60 may be defined with bottom boundaries 601 and 621 and top boundaries 602 and 622 after step S1302. If the bottom boundaries 601 and 621 do not overlap the corresponding top boundaries 602 and 622, the marked geometric patterns 62a and 62b and the non-marked geometric patterns 60 may have their own thickness values. Preferably, the thickness of the marked geometric patterns 62a and 62b and the non-marked geometric patterns 60 are all equal, but not limited thereto.

Figure 11:
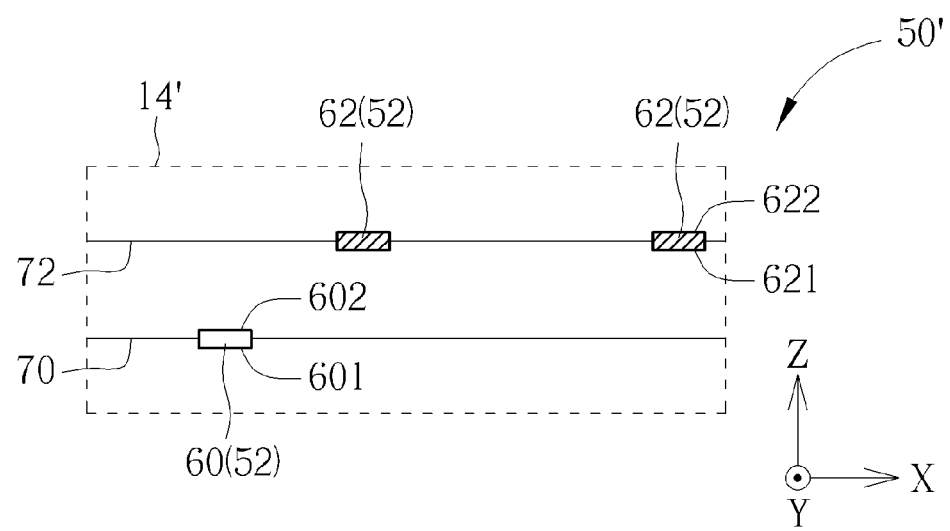
FIG. 11 is a schematic diagram showing a 3-D design layout according to a third embodiment of the invention.

Please refer to FIG. 11. FIG. 11 is a schematic diagram showing a 3-D design layout according to a third embodiment of the invention. The 3-D design layout 50' shown in FIG. 11 according to the third embodiment of the present invention is similar to that shown in FIG. 8 according to the first embodiment of the present invention. One main difference between these two embodiments is that the number of the marked geometric pattern is greater than one according to the third embodiment. As shown in FIG. 11, at least two marked geometric patterns 62 are located in the same height with the second axis value 72, while at least one non-marked pattern 62 is located in a height with the first axis value 70. Similarly, all the marked geometric patterns 62 and the non-marked geometric patterns 60 may be defined with bottom boundaries 601 and 621 and top boundaries 602 and 622 after step S1302. If the bottom boundaries 601 and 621 do not overlap the corresponding top boundaries 602 and 622, the marked geometric patterns 62a and 62b and the non-marked geometric patterns 60 may have their own thickness values. Preferably, the thickness of the marked geometric patterns 62a and 62b and the non-marked geometric patterns 60 are all equal, but not limited thereto.

To summarize, the embodiments of the present invention provides a calculation method for generating a 3-D layout pattern in a photomask. One characteristic feature of the embodiments of the present invention is that the 3-D design layout includes several geometric patterns distributed along the z-axis and may be sent to the corresponding mask-making system afterwards. As a result, the corresponding photomask may have the same features defined by the 3-D design layout. and the optical problems, such as flares or distortions possibly resulting from the subsequent photolithographic process, may be prevented or overcome by using the photomask with the 3-D design layout.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A calculation method for generating a layout pattern in a photomask, comprising:
providing a computer system having a computer readable storage device;
providing a two-dimensional (2-D) design layout to the computer system, wherein the 2-D design layout comprises a plurality of geometric patterns distributed in a plane;
marking portions of the geometric patterns to generate at least one marked geometric pattern and at least one non-marked geometric pattern;
moving the marked geometric pattern along an axis orthogonal to the plane so as to convert the 2-D design layout to a three-dimensional (3-D) design layout, wherein the marked geometric pattern and the non-marked geometric pattern of the 3-D design layout are arranged alternately along the axis orthogonal to the plane; and outputting the 3-D design layout to a mask-making system.

2. The method according to claim 1, before providing the 2-D design layout, furthering comprising:

providing a 3-D circuit design to another computer system; and translating the 3-D circuit design into the 2-D design layout.

3. The method according to claim 1, during marking the portions of the geometric patterns, further comprising:

considering a plurality of factors affecting dimensions and shapes of corresponding geometric patterns to be translated to a layer over a substrate; and marking the portions of the geometric patterns in terms of the factors.

4. The method according to claim 3, wherein the factors comprise densities of patterns, shapes of patterns, film thickness uniformity, and substrate topography.

5. The method according to claim 1, wherein each of the marked geometric patterns and the non-marked geometric patterns are further defined with bottom boundaries and top boundaries after calculating the marked geometric pattern.

6. The method according to claim 5, wherein the bottom boundary of the marked geometric pattern is spaced apart from the top boundary of the non-marked geometric pattern along the axis after calculating the marked geometric pattern.

7. The method according to claim 5, wherein the bottom boundary of the marked geometric pattern is aligned with the top boundary of the non-marked geometric pattern along the axis after calculating the marked geometric pattern.

8. The method according to claim 1, wherein at least two of the marked geometric patterns have an equal axis value after calculating the marked geometric pattern.

9. The method according to claim 1, wherein at least two of the non-marked geometric patterns have an equal axis value after calculating the marked geometric pattern.

10. The method according to claim 1, wherein the non-marked geometric pattern and the marked geometric pattern respectively have a first axis value and a second axis value, and the first axis value and a second axis value are not equal.

11. The method according to claim 1, wherein the marked geometric pattern is spaced apart from the non-marked geometric pattern.

12. The method according to claim 1, wherein the 3-D design layout is distributed in a 3-D space.

13. The method according to claim 1, wherein the mask-making system is a 3-D printing system.

14. The method according to claim 13, wherein the first marked geometric pattern is spaced apart from the second marked geometric pattern after calculating the marked geometric pattern.

15. The method according to claim 1, wherein the marked geometric patterns comprise at least one first marked geometric pattern and at least one second marked geometric pattern, and the first marked geometric pattern and the second marked geometric pattern are arranged alternately along the axis after calculating the marked geometric pattern.

16. The method according to claim 15, wherein each of the marked geometric patterns and the non-marked geometric patterns are further defined with bottom boundaries and top boundaries after calculating the marked geometric pattern.

17. The method according to claim 16, wherein the bottom of the first marked geometric pattern is spaced apart from the top of the second marked geometric pattern along the axis after calculating the marked geometric pattern.

18. The method according to claim 16, wherein the bottom boundary of the first marked geometric pattern is aligned with the top boundary of the non-marked geometric pattern along the axis after calculating the marked geometric pattern.

19. A method for forming a pattern on a substrate, comprising fabricating a photomask including the 3-D design layout according to claim 1.

20. The method according to claim 19, further comprising transferring the 3-D design layout from the photomask into a layer on the substrate.

* * * * *